(12) United States Patent
Wang et al.

(10) Patent No.: US 10,163,738 B2
(45) Date of Patent: Dec. 25, 2018

(54) STRUCTURE AND METHOD FOR OVERLAY MARKS

(71) Applicant: TAIWAN SEMICONDUCTOR MANUFACTURING COMPANY, LTD., Hsinchu (TW)

(72) Inventors: Hsien-Cheng Wang, Hsinchu (TW); Ming-Chang Wen, Kaohsiung (TW); Chun-Kuang Chen, Hsinchu (TW); Yao-Ching Ku, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/371,465

(22) Filed: Dec. 7, 2016

(65) Prior Publication Data

US 2017/0084506 A1    Mar. 23, 2017

Related U.S. Application Data

(62) Division of application No. 13/293,650, filed on Nov. 10, 2011, now Pat. No. 9,543,406.

(60) Provisional application No. 61/418,064, filed on Nov. 30, 2010.

(51) Int. Cl.
| | | |
|---|---|---|
| *G03F 7/20* | (2006.01) | |
| *H01L 21/66* | (2006.01) | |
| *H01L 29/66* | (2006.01) | |
| *H01L 21/265* | (2006.01) | |
| *H01L 29/51* | (2006.01) | |

(52) U.S. Cl.
CPC .......... *H01L 22/32* (2013.01); *G03F 7/70633* (2013.01); *H01L 21/265* (2013.01); *H01L 29/66545* (2013.01); *H01L 29/517* (2013.01)

(58) Field of Classification Search
CPC . H01L 22/32; H01L 21/265; H01L 29/66545; H01L 29/517; H01L 23/544; G03F 7/70633
See application file for complete search history.

(56) References Cited

U.S. PATENT DOCUMENTS

| | | | |
|---|---|---|---|
| 8,163,572 B2 | 4/2012 | Hashimi | |
| 8,736,084 B2* | 5/2014 | Cheng | H01L 22/12 257/797 |
| 2002/0009824 A1 | 1/2002 | Maeda | |
| 2006/0060904 A1 | 3/2006 | Hong | |
| 2007/0026629 A1* | 2/2007 | Chen | H01L 21/823412 438/424 |
| 2007/0138561 A1 | 6/2007 | Hashimi et al. | |
| 2008/0237661 A1 | 10/2008 | Ranade et al. | |

(Continued)

*Primary Examiner* — Latanya N Crawford
(74) *Attorney, Agent, or Firm* — Hauptman Ham, LLP

(57) ABSTRACT

A partially fabricated semiconductor device includes a semiconductor overlay structure. The semiconductor overlay structure includes a first gate stack structure over the semiconductor substrate, the first gate stack structure being configured as an overlay mark in an overlay region of the semiconductor substrate. The semiconductor overlay structure further includes a doped region in the semiconductor substrate surrounding the first gate stack structure. The doped region has a first dopant concentration greater than or equal to a second dopant concentration next to a second gate stack structure in a device region of the semiconductor substrate.

20 Claims, 11 Drawing Sheets

(56) References Cited

U.S. PATENT DOCUMENTS

| | | |
|---|---|---|
| 2009/0090982 A1 | 4/2009 | Ranade et al. |
| 2009/0098696 A1 | 4/2009 | Lin et al. |
| 2010/0052060 A1 | 3/2010 | Lai et al. |
| 2010/0052191 A1* | 3/2010 | Trogisch ................ G03F 9/708 257/797 |
| 2010/0059833 A1 | 3/2010 | Yu |
| 2010/0117154 A1 | 5/2010 | Ye |
| 2010/0197105 A1* | 8/2010 | Uchiyama ............. G03F 9/7076 438/401 |
| 2011/0241119 A1* | 10/2011 | Chen .................... G03F 9/7076 257/368 |
| 2011/0254054 A1 | 10/2011 | Itou |
| 2011/0284966 A1 | 11/2011 | Wen et al. |
| 2011/0285036 A1 | 11/2011 | Yao et al. |
| 2012/0038021 A1 | 2/2012 | Chen et al. |
| 2013/0330904 A1 | 12/2013 | Yao |

* cited by examiner

STRUCTURE AND METHOD FOR OVERLAY MARKS

PRIORITY CLAIM

The present application is a divisional of U.S. application Ser. No. 13/293,650, filed Nov. 10, 2011, which claims priority of U.S. Provisional Application No. 61/418,064, filed Nov. 30, 2010, which are incorporated herein by reference in their entireties.

TECHNICAL FIELD

The present disclosure relates generally to overlay marks for lithographic processes and, more particularly, to a structure and method for an improved overlay mark for high-k metal gate processes.

BACKGROUND

Overlay marks are important in fabrication of semiconductor, or integrated circuit ("IC"), devices because the devices are produced by aligning several layers of conductive, semiconductive, and insulative materials one atop the other. It is critical that each layer is precisely aligned with the previous layer so that the resultant circuits are functional and reliable. If the layers are not correctly aligned, some features may be short-circuited while others may be open circuited or have an unacceptably large resistance. Typically for each technology node, an overlay error threshold is specified in the x or y direction. In other words, each layer cannot shift more than a specified distance from another layer above or below. A shift greater than the specification causes an "alignment fail", which increases cycle time because layers may have to be reworked.

During an overlay check, the position of the overlay mark on the wafer is typically sensed using a laser beam, which is bounced off the overlay mark to produce a reflected light signal reflected back to an inspector on a machine. The inspector then analyzes the reflected light signal to determine the exact position of the overlay mark. Notably, the quality of the signal reflected from the overlay mark is directly dependent on the the structure and the materials. Methods to improve overlay mark signals continue to be sought.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
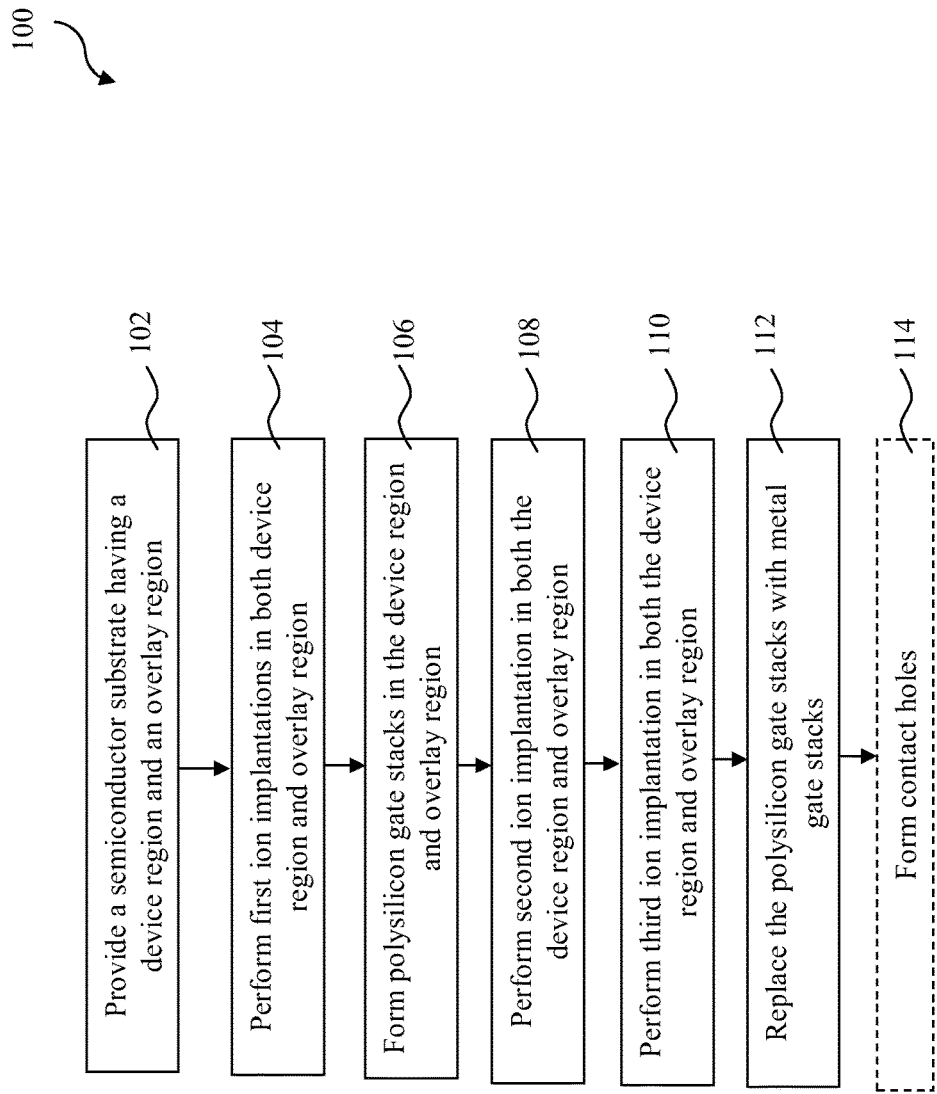
FIG. 1 is a flowchart of a method for making a semiconductor structure having an overlay mark constructed according to various aspects of the present disclosure.

The present disclosure relates generally to overlay marks for lithographic processes and, more particularly, to a structure and method for an improved overlay mark for high-k metal gate (HKMG) lithography processes. It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

During a lithography exposure process, a wafer may be exposed to a pattern on a photomask in many steps. A wafer also may be separated into many fields where each field is exposed separately using the same photomask. To ensure that successive layers are stacked correctly, alignment marks and overlay marks are used. Alignment marks on a wafer are not field specific and each wafer may include two or more groups of alignment marks at different locations. When a wafer is loaded onto a stepper for exposure to a pattern from a photomask, the wafer is first aligned using the alignment marks. The stepper reads the alignment marks to orient the wafer before stepping through exposing each field.

Overlay marks are used to ensure successive mask exposures are overlaid over each other within a tolerance specified by the technology node. Overlay marks are repeated in each field, usually at multiple locations with several marks formed at each location. Each field includes one or more device regions where semiconductor devices are formed, and one or more overlay mark regions. Common overlay patterns include a grating-based mark or a box-in-box mark. A box-in-box mark is formed first by forming the outer box while forming a feature in the device region and then forming the inner box while forming another feature in the device region. The boxes are analyzed by measuring a light reflected from them. The centers of the outer box and the inner box are calculated and compared. An overlay error is defined as the distance between the centers of the two boxes. A minimum one-dimensional error in the x or the y direction is usually specified to be a percentage of the half pitch of a feature in the technology node. For example, for the 20 nanometer (nm) technology node, the one-dimensional overlay error is specified to be less than 6 nm.

To determine an overlay error in a box-in-box mark, the centers of at least two layers in an overlay mark are compared. An overlay region in a field includes many marks with each mark having a different combination of layers. One overlay mark may include an oxide definition (OD) layer and a polysilicon (poly) layer. Another overlay mark may include the OD layer and a contact layer. Yet another overlay mark may include the contact layer and a poly layer. Thus, each mark can provide one or more overlay error values. The relevance of a particular overlay error depends on where the wafer is in the semiconductor manufacturing process.

Various methods are used to reduce overlay error before, during, or after exposure. Commonly, overlay errors are checked after the exposure operation in a separate inspection tool. A wafer having unacceptable overlay errors for that particular manufacturing step is reworked by removing and re-depositing the photoresist layer and re-exposed. While in-situ overlay correction during the exposing operation is desirable for reducing time-consuming rework, it introduces much delay during the lithography operation if the overlay error measurement occurs just before each field exposure. Another effective method is a correction per exposure (CPE) technique that uses stored overlay error values and improves process time over in-situ measurement methods. While various overlay correction methods are developed and used to improve overlay errors from field to field, the quality of the overlay correction is directly affected by the measurement of the overlay marks and calculation of the center of the boxes.

To measure a precise location of the layers in the overlay mark, an inspection tool measures light reflected across the mark. The signal received from different areas of the overlay mark differs based on the difference in material properties of the layers. The signal is then normalized, and an algorithm is used to find the edge location of the layers. When the material properties of the different layers are similar, the interface between the layers may be difficult to determine. Material property factors that influence the quality of the signal include reflectivity, refractive index, surface roughness, and thickness. Process conditions such as incident light angle, shadowing, inspection light wavelength can also influence signal quality. The edge location of the material layer forming a box as determined by the algorithm can have large errors. A quantified quality of the signal is known as wafer quality (WQ), which is expressed as a percentage of actual signal strength with reference to a signal generated by a reference mark. WQ may be defined as $$WQ = (SS_{overlay}/\text{Gain}_{overlay})/(SS_{ref}/\text{Gain}_{ref})$$

Where $SS_{overlay}$ is the signal strength of the overlay signal from the overlay mark, $\text{Gain}_{overlay}$ is the signal strength of the gain of the overlay signal, $SS_{ref}$ is the signal strength of the reference signal from the reference mark, and $\text{Gain}_{ref}$ is the gain of the reference signal.

Usually, WQ should be more than 1% in order to obtain reliable overlay results. A WQ less than 1% can correspond to enough measurement error for box centers such that subsequent CPE or other correction causes further overlay error. For example, a small true overlay error may be reported as a larger overlay error in the opposite direction, such that a CPE processing causes the true overlay error to increase, instead of correcting for the overlay error. With high-k metal gate replacing polysilicon, the structure of the overlay provides a WQ less than 1%, such as 0.05%-0.4%. Various factors that can lower the WQ include measurement variations from field to field (local effect), wafer edge distortion (edge die effect), and damage to an OD dummy layer causing discoloration. As feature sizes decrease, the specified overlay error threshold also decreases. Coupling to the ever more stringent overlay error threshold is the decrease in signal contrast caused by using advanced materials to form various structures.

In one aspect, various embodiments of the present invention pertain to processes and structures that improve WQ in overlay regions for semiconductor devices using advanced metal gate materials, such as high-k metal gate (HKMG). In one embodiment, using the disclosed structure increases the WQ to be greater than 3%, as averaged over different inspector light sources: red, green, near infrared, and far infrared. The process includes subjecting the substrate areas adjacent to the overlay mark to various ion implantations that are used to form various features in the device region. The various ion implantations decrease the refractive index of the substrate to about 3 or less than about 3. The structure has improved WQ because the contrast between the overlay layer and adjacent substrate material is higher than with an undoped substrate or a lightly doped substrate. In other words, the various embodiments of the present disclosure work by darkening the semiconductor substrate area as seen by the inspector tool relative to the lighter overlay layers.

In certain embodiments, the process includes: providing a semiconductor substrate having a device region and an overlay region; performing a first ion implantation to the semiconductor substrate within the device region and the overlay region; forming a first polysilicon gate stack in a device region and a second polysilicon gate stack in an overlay region; performing a second ion implantation; performing a third ion implantation; and replacing the first and second polysilicon gate stacks with metal gate stacks. After the various ion implantation operations, the total boron ion implantation dosage to the semiconductor substrate within the overlay region is greater than about $2 \times 10^{15}$ ions/cm$^2$.

The process may also include measuring an overlay error using the metal gate stacks in the overlay region and another overlay layer, correctively exposing a photoresist layer using the overlay error, and optionally forming an interlayer dielectric (ILD) material layer on the semiconductor substrate. In most embodiments, the second ion implantation and the third ion implantation are applied to the first polysilicon gate stack and the semiconductor substrate within the device region and to the second polysilicon gate stack and the semiconductor substrate within the overlay region. In some embodiments, one or more of the ion implantation operations may be applied to HKMG stack. The process may also include performing one or more ion implantations to structures and the semiconductor substrate within the device region and to structures and the semiconductor substrate within the overlay region, which may occur before or after replacing the gate stacks.

According to various embodiments, the total ion implantation dosage may include arsenic at greater than about $3 \times 10^{15}$ ions/cm$^2$ and one or more of indium at greater than about $1 \times 10^{14}$ ions/cm$^2$, nitrogen at greater than $1.2 \times 10^{15}$ ions/cm$^2$, and carbon at greater than about $2.4 \times 10^{15}$ ions/cm$^2$. In certain embodiments, the second ion implantation includes n-type light-doped drain (n-LDD) doping process with doping dose greater than about $2 \times 10^{14}$ ions/cm$^2$. In some embodiments, performing the first, the second, and the third ion implantations increases a wafer quality of an overlay signal from the overlay region to be greater than about 3%.

Another aspect of the present disclosure pertains to partially fabricated semiconductor wafers that include a semiconductor overlay structure. The semiconductor overlay structure includes a gate stack structure formed on the semiconductor substrate and configured as an overlay mark in an overlay region on a semiconductor wafer, a doped semiconductor substrate on both sides of the gate stack structure, wherein the doped semiconductor substrate includes a dopant concentration that is at least the same or higher than as the dopant concentration in the semiconductor substrate next the gate stack structures in a device region on the semiconductor wafer. The overlay structure may further include a contact layer formed on the semiconductor substrate in the vicinity of the gate structure, and wherein the doped semiconductor is disposed between the gate stack structure and the contact layer.

In some embodiments, the gate stack structure includes a high-k dielectric material layer and a metal layer disposed on the high-k dielectric material layer or a silicon oxide layer and a polysilicon layer disposed on the silicon oxide layer. The gate stack structure is configured as a grating structure or as one box of a box-in-box structure. The contact layer may be configured as an inner box of the box-in-box structure. In certain embodiments, the dopant in the semiconductor substrate includes one or more of boron containing compounds, such as boron fluoride ($BF_2$), arsenic (and/or phosphorus), indium, nitrogen, and carbon. The semiconductor substrate in the overlay region includes silicon and may have a refractive index of about 3 or less.

FIG. 1 is a flowchart of a method 100 for making a semiconductor device according to one embodiment. The semiconductor device includes a metal gate stack and an overlay mark constructed according to various aspects of the present disclosure. FIGS. 2 through 10 are sectional views of a semiconductor structure 200 at various fabrication stages and constructed according to various embodiments. The semiconductor structure 200 and the method 100 of making the same are collectively described with reference to FIGS. 1 through 10.

Figure 2:
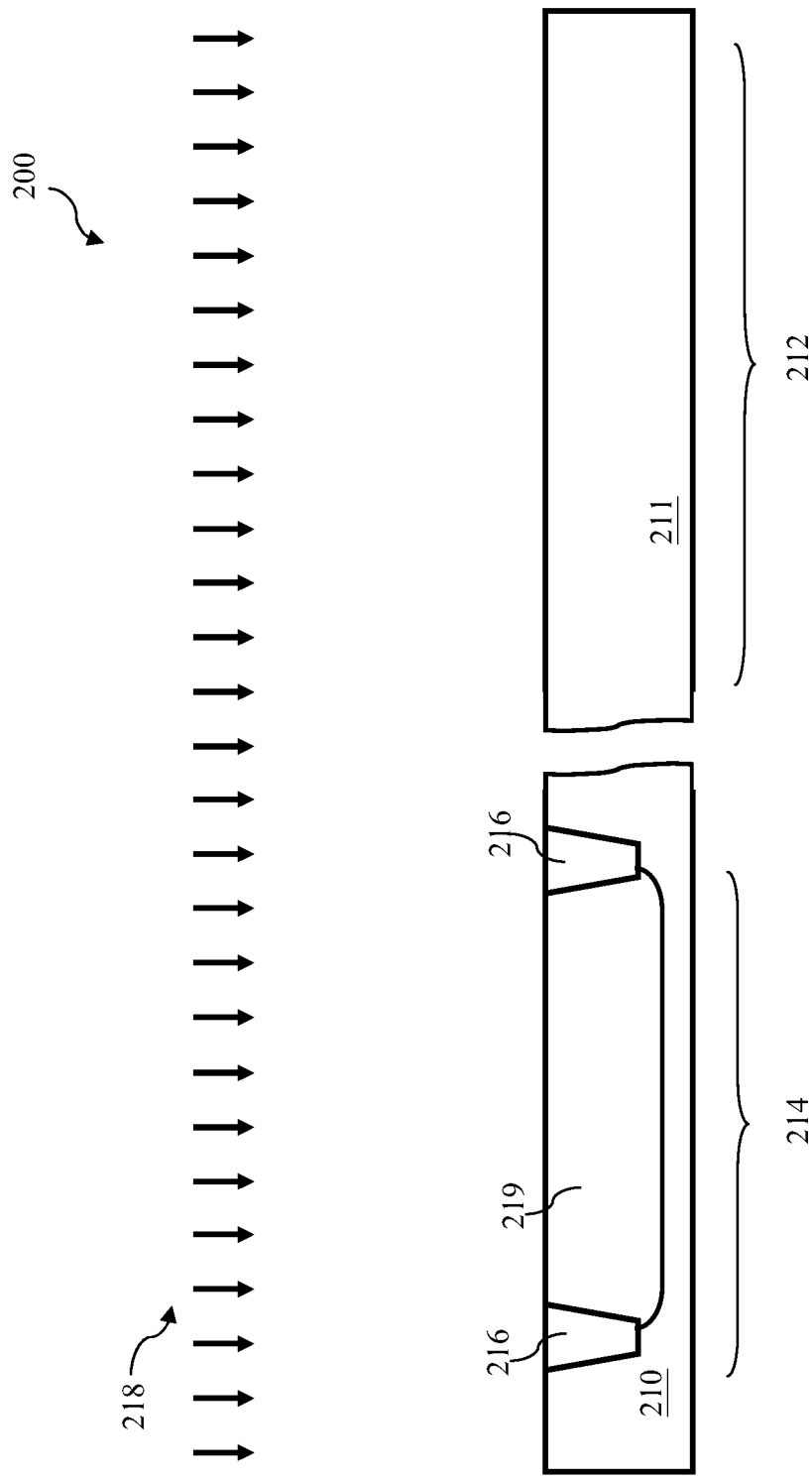
FIGS. 2-10 are sectional views of a semiconductor structure having an overlay mark at various fabrication stages constructed according to various aspects of the present disclosure in various embodiments.

Referring to FIGS. 1 and 2, the method 100 begins at step 102 by providing a semiconductor substrate. The semiconductor substrate includes silicon. Alternatively, the semiconductor substrate includes germanium, silicon germanium or other proper semiconductor materials. The semiconductor substrate also includes various isolation features, such as shallow trench isolation (STI) features formed in the semiconductor substrate to separate various devices. The semiconductor substrate includes an overlay region 212 for an overlay mark and a device region 214 for one or more field-effect transistors (FETs) and/or other devices. Various STI features 216 are formed in the semiconductor substrate 210 in the device region 214. The formation of the STI features 216 includes etching a trench in a substrate and filling the trench by one or more insulator materials, such as silicon oxide, silicon nitride, or silicon oxynitride. The filled trench may have a multi-layer structure such as a thermal oxide liner layer with silicon nitride filling the trench. In one embodiment, the STI feature 216 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI features. The semiconductor substrate 210 also includes various n-wells and p-wells formed in various active regions.

Still referring to FIGS. 1 and 2, the method 100 proceeds to step 104 by performing a first ion implantation to introduce doping species in the semiconductor substrate 210 in the device region 214 and semiconductor substrate 211 in the overlay region 212. The first ion implantation 218 includes one or more ion implantations implemented before the formation of gate stacks to form various doped features 219. In one embodiment, the first ion implantation 218 includes a well ion implantation to form a well, such as an n-type well (n-well) or a p-type well (p-well), an ion implantation to adjust threshold voltage, an anti-punch through (APT) ion implantation, or combinations thereof. An ion implantation process 218 is applied to the device region 214 and overlay region 212 such that doping species form the respective doped feature 219 in the device region, and the entire substrate 210 in the overlay region 212 is doped.

In one example, when a p-type dopant is introduced to the semiconductor substrate to form one or more p-wells, an implant mask layer is patterned to cover a portion of the device region for an n-well, then a p-type dopant is introduced to the semiconductor substrate 210 by an ion implantation to form one or more p-wells in the device region 214. The implant mask layer may be formed using a photolithography process including photoresist coating, soft baking, exposing, post-exposure baking (PEB), developing, and hard baking. The implant mask layer is removed thereafter using a suitable process, such as wet stripping or plasma ashing. Alternatively, a patterned photoresist layer may be used to pattern a hard mask layer to be used as an implant mask. According to various embodiments, the semiconductor portion 211 in the overlay region receives all or most of the dopants implanted in the device region while various portions of the device region are covered during the implantation process to form various features. Thus, the semiconductor portion 211 in the overlay region 212 receives a higher dopant dosage than the semiconductor portion 210 in the device region 214.

Figure 3:
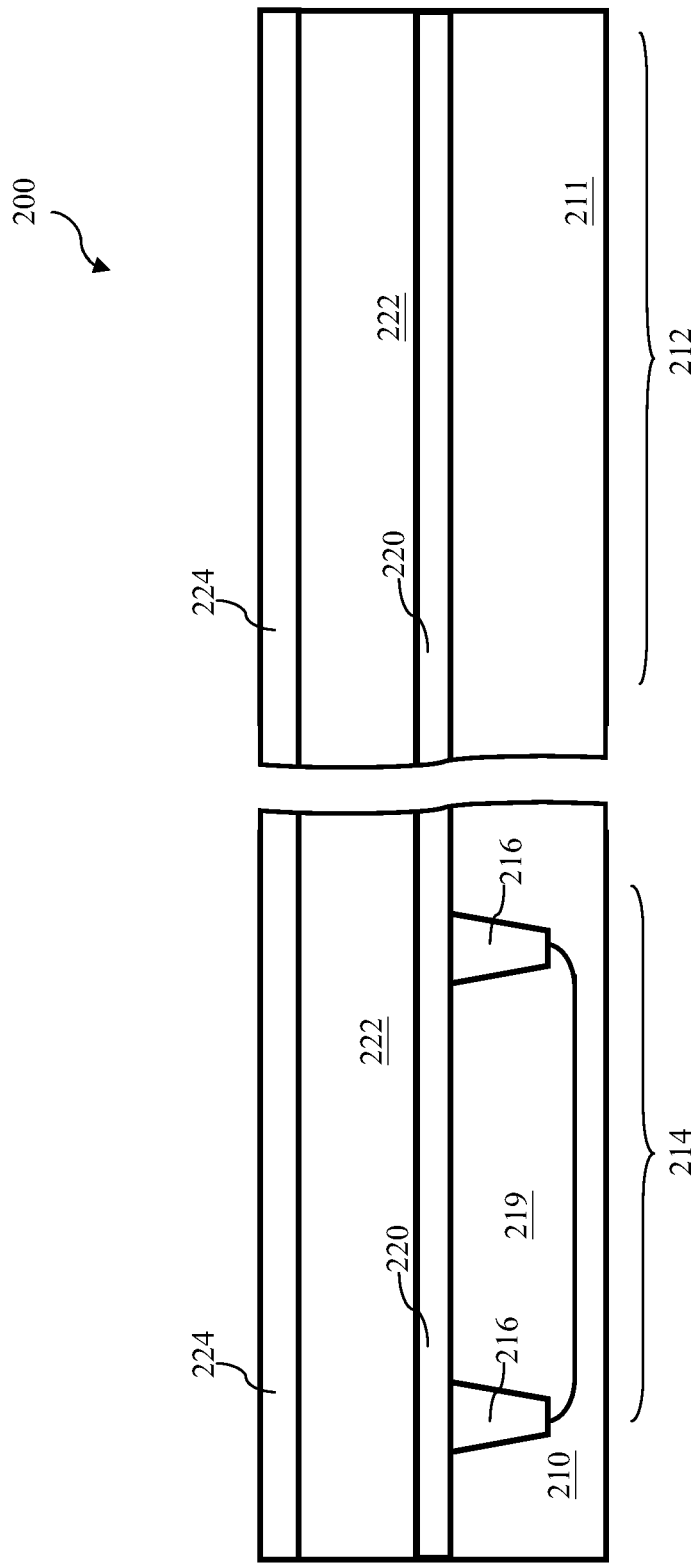
Figure 4:
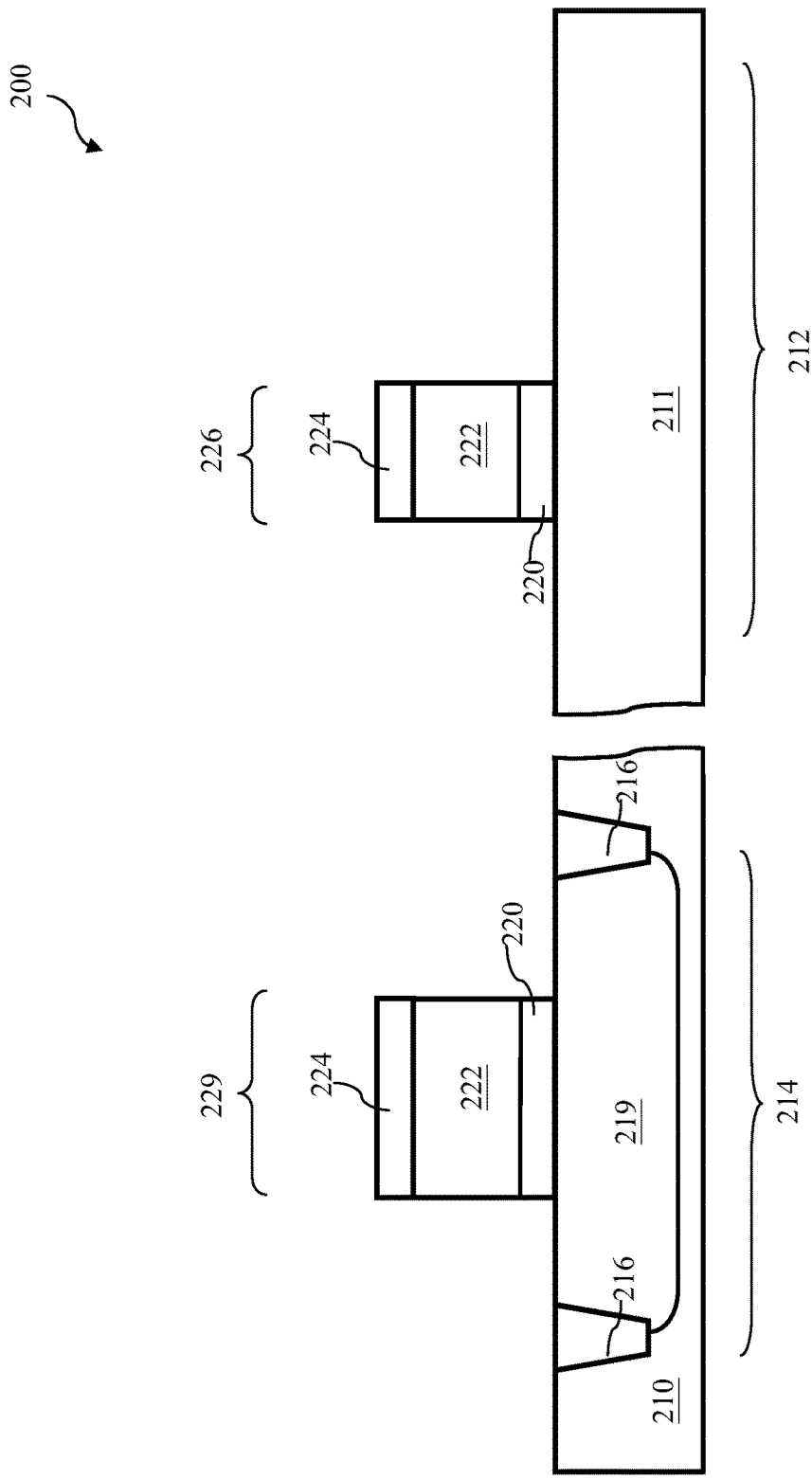

Referring to FIGS. 1, 3 and 4, the method 100 proceeds to step 106 by forming gate stacks in the device region 214 and the overlay region 212. In one embodiment, various gate material layers are formed on the semiconductor substrate 210 and 211 as illustrated in FIG. 3. The gate material layers include a dielectric material layer 220 and a silicon layer 222, such as polycrystalline silicon (polysilicon). In the present embodiment, the silicon layer 222 may be non-doped and the dielectric material layer 220 includes a high-k dielectric material layer. The silicon layer 222 alternatively or additionally may include amorphous silicon. The high-k dielectric material layer 220 includes a dielectric material having the dielectric constant higher than that of thermal silicon oxide, which is about 3.9. In one example, the high-k dielectric layer 220 includes hafnium oxide (HfO). In various other examples, the high-k dielectric layer 220 includes metal oxide, metal nitride, or combinations thereof. In one example, the high-k dielectric layer 220 has a thickness ranging between about 10 angstrom and about 100 angstrom.

In various embodiments, the gate material layers include multi-layer dielectric materials, such as an interfacial layer (e.g., silicon oxide) and a high-k dielectric material layer disposed on the interfacial layer. In another embodiment, a hard mask layer 224, such as silicon nitride (SiN) or silicon oxide ($SiO_2$), is further formed on the gate material layers for gate patterning. In various embodiments, the interfacial layer may be formed by chemical oxide technique, thermal oxide procedure, atomic layer deposition (ALD) or chemical vapor deposition (CVD). The high-k dielectric material layer may be formed by CVD, ALD, plasma enhanced CVD (PE CVD), or plasma enhanced ALD (PEALD). The non-doped amorphous silicon or polysilicon layer 222 can be formed using CVD with precursor silane ($SiH_4$) or other silicon based precursor. The deposition of the non-doped amorphous silicon layer 222 can be performed at a raised temperature. The hard mask layer (SiN or $SiO_2$) can be formed by CVD or other suitable technique.

The gate material layers are patterned to form one or more gate stacks 226 and 228 in the overlay region 212, and one or more gate stacks (or dummy gates) 229 in the device region 214, as illustrated in FIG. 4. The patterning of the gate material layers can be achieved by a lithography process and/or an etch process. For example, a patterned photoresist layer is formed on the hard mask layer 224 defining various gate regions, using a photolithography process including photoresist coating, soft baking, exposing, post-exposure baking (PEB), developing, and hard baking. Then, the hard mask layer 224 is etched through the openings of the patterned photoresist layer, forming a patterned hard mask. The gate material layers are further etched using the patterned hard mask, forming the various gate stacks. The patterned photoresist layer is removed thereafter using a suitable process, such as wet stripping or plasma ashing. Alternatively, if the hard mask layer is not present, then the patterned photoresist layer is directly utilized as an etch mask to etch the gate material layers.

The gate stack 226 is configured to form one layer in an overlay mark. In one embodiment, the gate stack in the overlay region 212 is configured as a periodic structure to form a grating overlay mark. For example, the grating overlay mark includes two, three, four, or more gate stacks disposed periodically in parallel. In another embodiment, the overlay mark includes a gate stack designed as a square frame used by box-in-box or frame-in-frame overlay technologies. At the same time, the gate stack 229 is formed in the device region 214 for a field-effect transistor (FET), such as a metal-oxide-semiconductor (MOS) transistor. The FET can be an n-type field-effect transistor (nFET) or a p-type field-effect transistor (pFET). Alternatively, the gate stack 229 is formed in the device region 214 for an imaging sensor.

Figure 5:
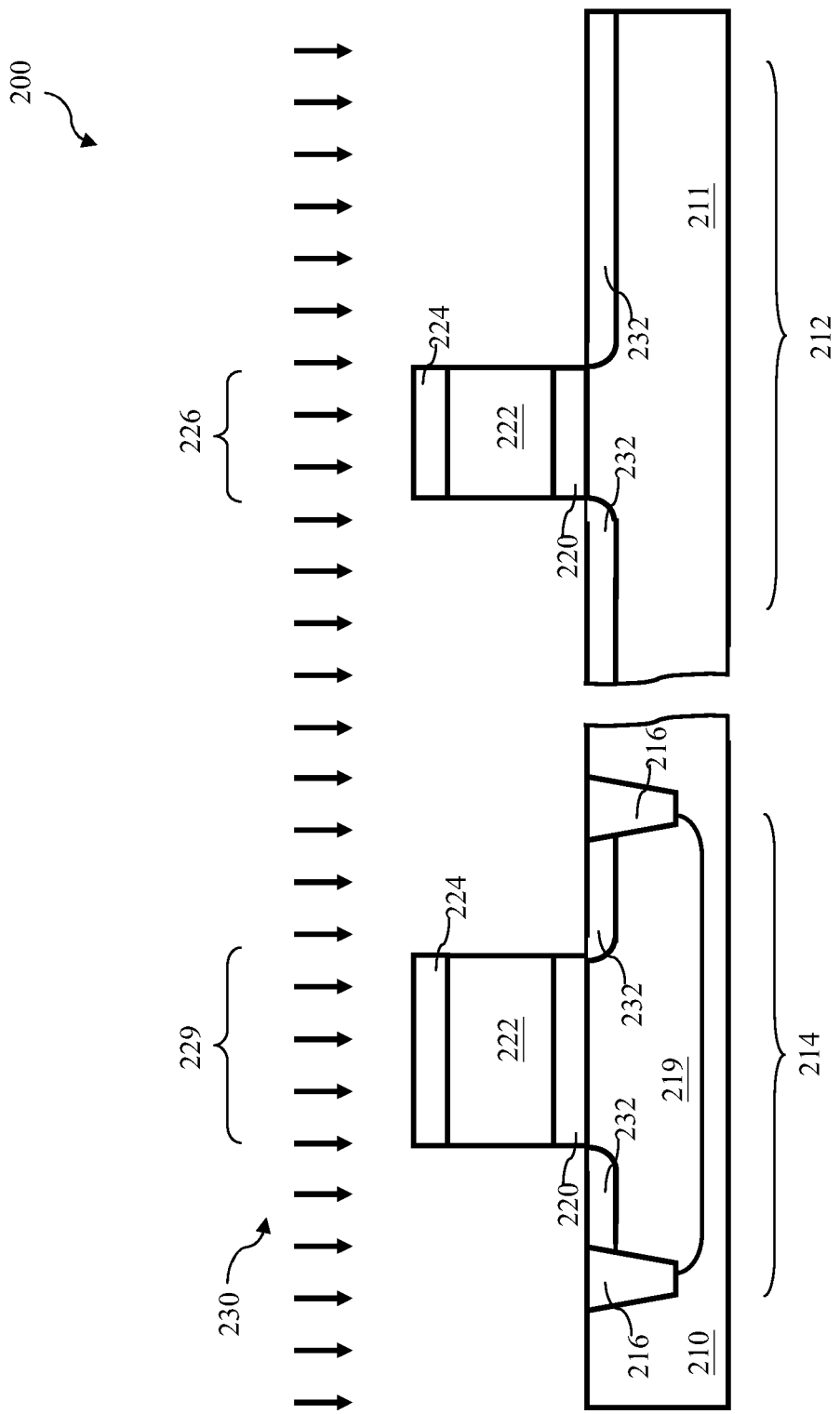
Figure 6:
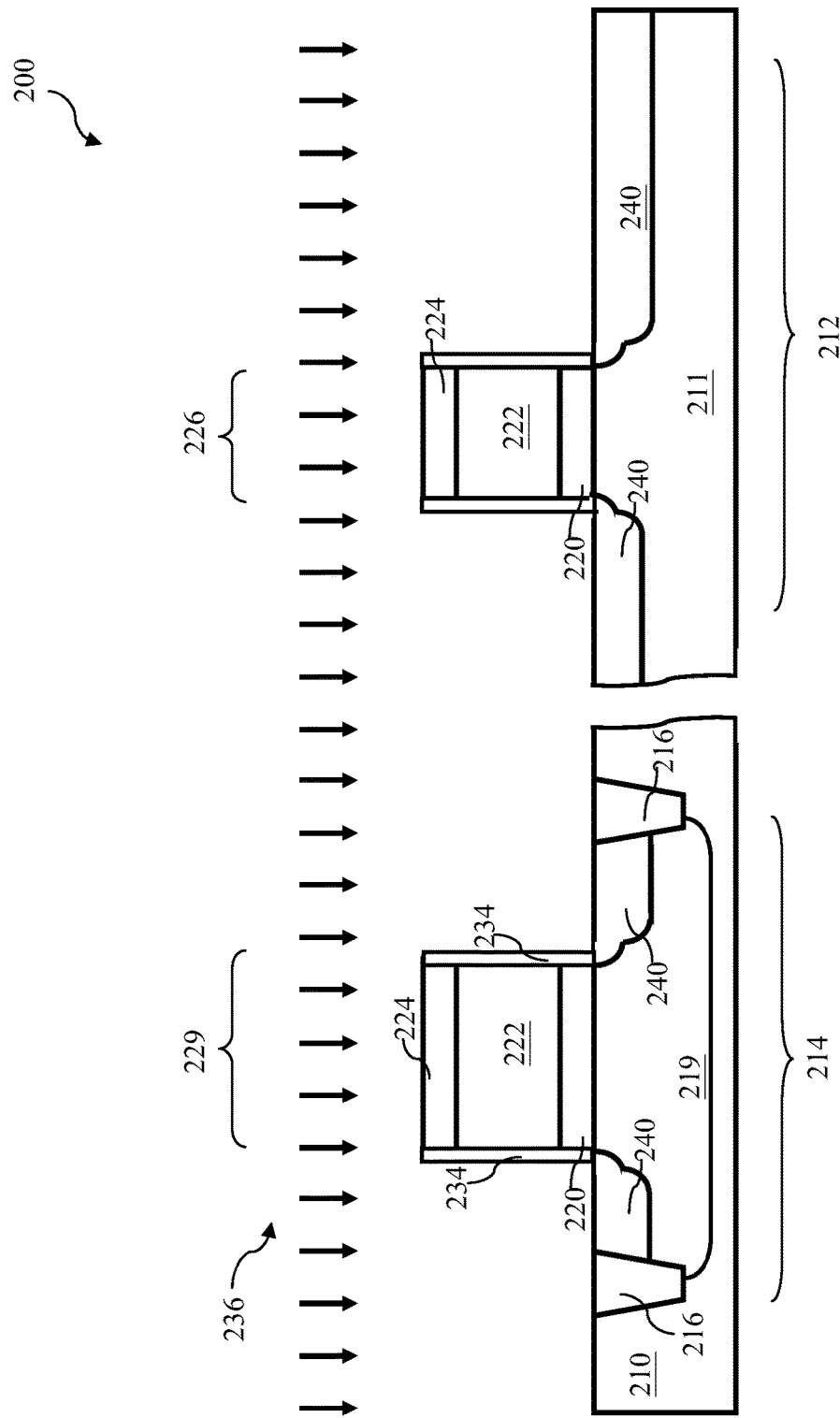

Referring to FIGS. 1 5 and 6, the method 100 proceeds to step 108 by performing a second ion implantation to introduce doping species into the semiconductor substrate 210 and 211 in both device region 214 and the overlay region 212. The second ion implantation is implemented after the formation of the gate stacks (e.g. 226 and 228) at step 106. The second ion implantation may include various implantation steps to form respective doped features. In one embodiment, the second ion implantation includes light doped drain (LDD) ion implantation and heavily doped source and drain (S/D) implantation. Since the second ion implantation is implemented after the formation of the gate stacks at step 106, the corresponding doped features are substantially formed on sides of the gate stacks but not in the channel regions directly underlying the gate stacks.

The second ion implantation may include an LDD implantation 230 to form various LDD features 232 in the overlay region 212 and the device region 214, as illustrated in FIG. 5. In one example, an n-type dopant, such as phosphorous or arsenic, is introduced to the semiconductor substrate 210 in the device region 214 and the semiconductor substrate 211 in the overlay region 212 to form n-type LDD features. In the overlay region 212, the difference in the refractive index between the silicon substrate underlying the gate stack and LDD implanted silicon substrate can enhance the contrast of the overlay mark during the overlay inspection. In one example, the LDD implantation includes a dose about $10^{15}$ ions/cm$^2$ or greater than about $2 \times 10^{14}$ ions/cm$^2$. In another example, the LDD implantation includes an implant energy ranging between about 50 keV and about 100 keV. In one embodiment, the photomask having a LDD implant pattern defines an additional opening for the overlay region. For example, if the overlay region 212 has dimensions of 50 micron×882 micron, the corresponding photomask has an additional opening of 50 microns×882 microns for the overlay region 212 such that the LDD features are formed therein. In another embodiment, a p-type doping species, such as boron (B), may be alternatively used to form p-type LDD features in the overlay region 212.

The second ion implantation may further include heavily doped source and drain (S/D) features formed by another ion implantation step after the LDD. Therefore each gate stack in the device region 214 and the overlay region 212 include both LDD features and S/D features, collectively referred to as source and drain regions. When the device region 214 includes both n-type FETs (nFETs) and p-type FETs (pFETs), the source and drain regions are formed, respectively, for the n-type FETs and the p-type FETs, using proper doping species.

In one embodiment, taking n-type FETs as an example, the LDD features 232 are formed by an ion implantation with a light doping dose. Thereafter, sidewall spacers 234 are formed by dielectric deposition and anisotropic etch, such as plasma etch. Then, the heavily doped S/D features are formed by an ion implantation 236 with a heavy doping dose. The various source and drain features of the p-type FETs can be formed in a similar procedure but with opposite doping types.

In various embodiments, during various doping processes to form various n-type source and drain features, the semiconductor substrate 211 in the overlay region 212 is also doped, as illustrated in FIG. 6 and in step 110 of method 100 in FIG. 1. The sidewall spacer 234 can be formed to the gate stacks in the overlay region as well. In one embodiment, a high temperature annealing process may be followed to activate the various doping species in the source and drain features in the device region 214. In another embodiment, the second ion implantation additionally or alternatively includes a pocket ion implantation using the dopant opposite from that of the source and drain, and is formed in the substrate and adjacent to the channel region.

Figure 7:
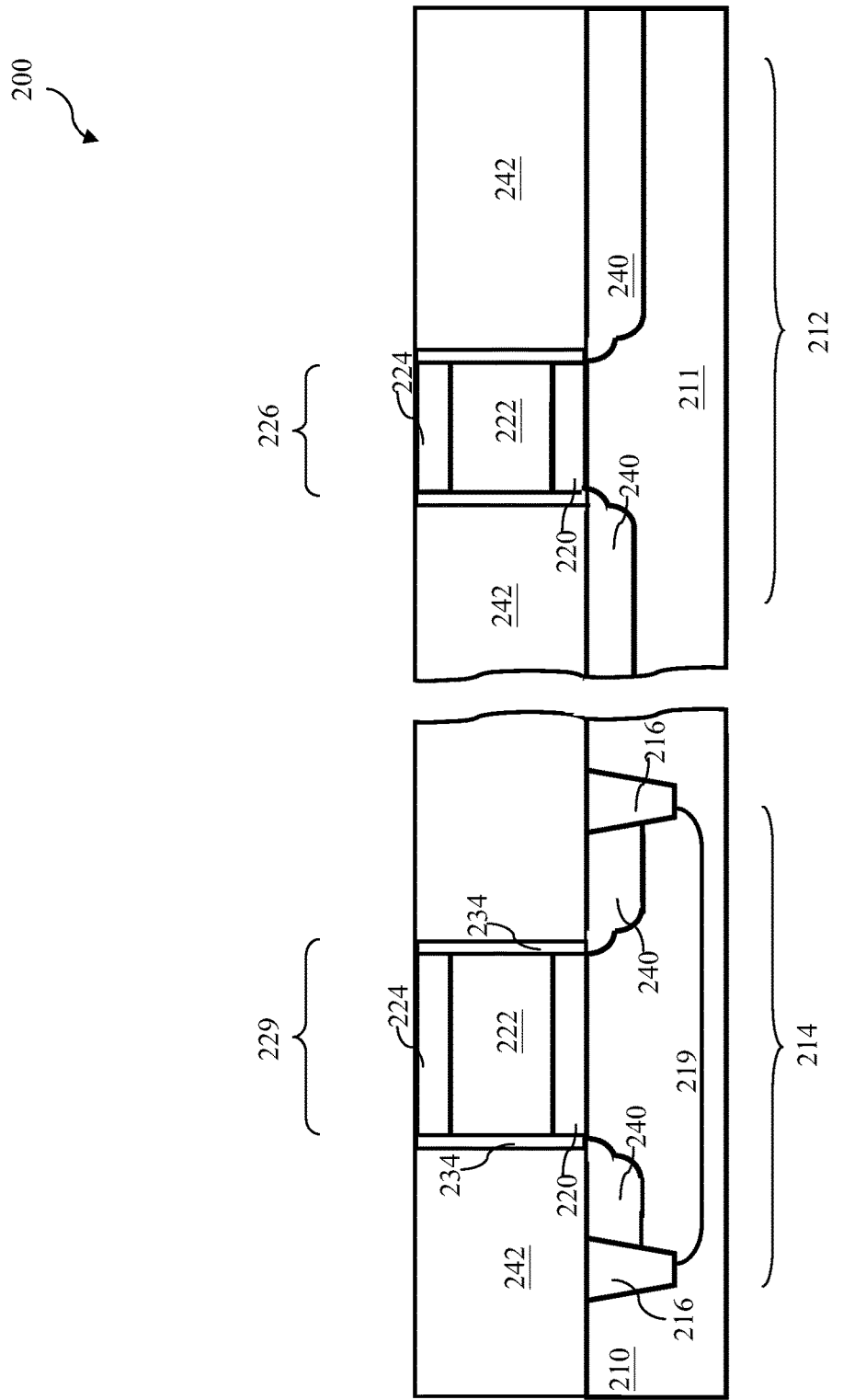
Figure 8:
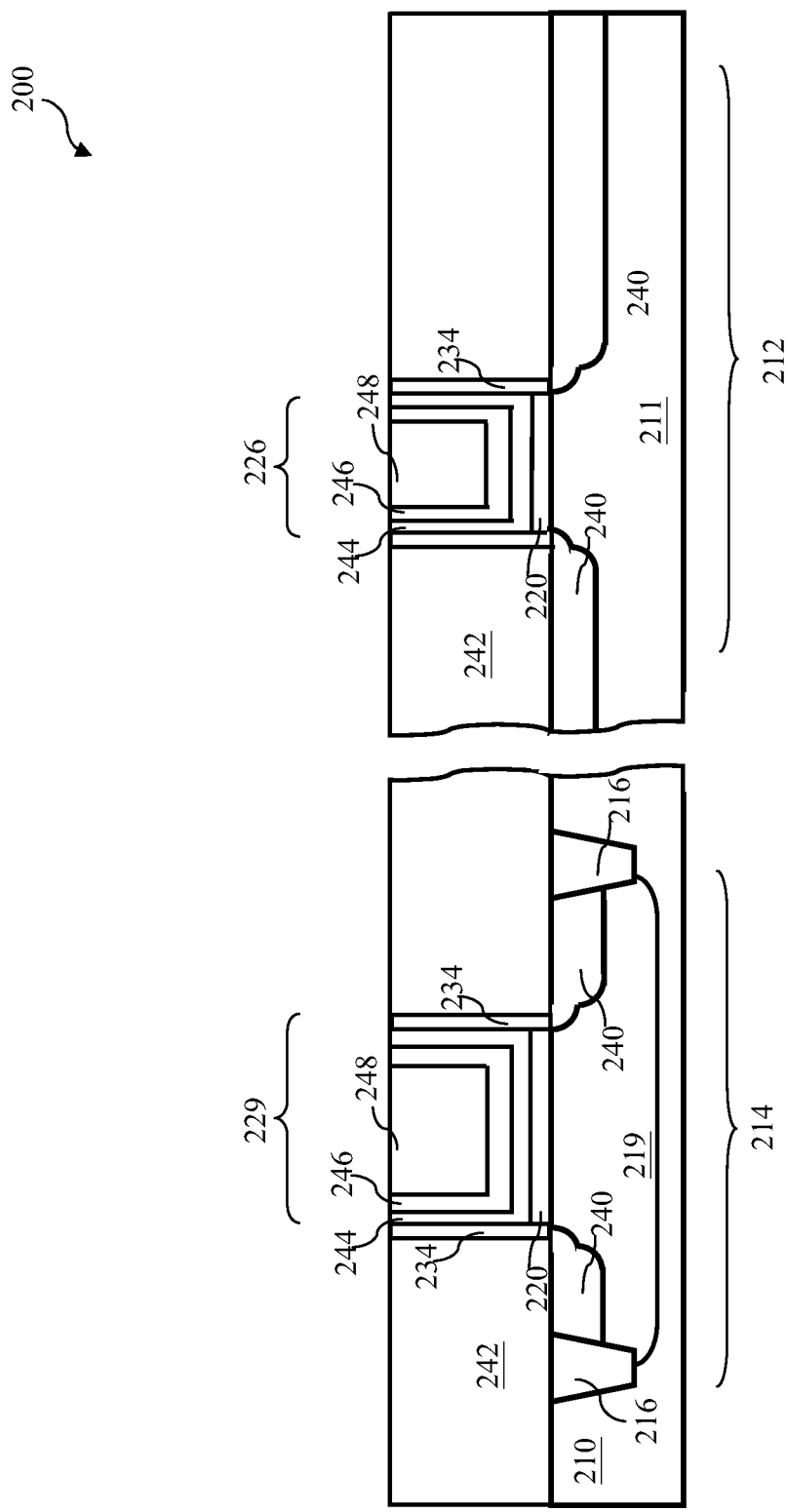

Referring to FIGS. 1, 7 and 8, the method 100 proceeds to step 112 by forming metal gates in the device region 214 and the overlay region 212. In one embodiment, an interlayer dielectric (ILD) layer 242 is first formed on the semiconductor substrate 210. The ILD layer 242 includes silicon oxide, low k dielectric material, other suitable dielectric materials, or combinations thereof. In another embodiment, the ILD layer 242 includes a buffer silicon oxide layer, a contact etch stop layer (CESL) formed on the buffer silicon oxide layer, and another dielectric material layer disposed on the CESL. The formation of the ILD layer 242 is described below.

The ILD layer 242 is formed by a suitable technique, such as CVD. For example, a high density plasma CVD can be implemented to form the ILD layer 242. In one embodiment, the ILD layer 242 deposits on the semiconductor substrate 210, and fills in the gaps between the gate stacks in the overlay region 212 and the gaps between the gate stacks in the device region 214. In furtherance of the embodiment, the ILD layer 242 is formed on the substrate to a level above the top surface of the gate stacks 226 and 229. A chemical mechanical polishing (CMP) process is then applied to the ILD layer 242 to reduce the thickness of the ILD layer 242 such that the gate stacks 226 and 229 are exposed from the top side. The processing conditions and parameters of the CMP process, including slurry chemical and polishing pressure, can be tuned to partially remove and planarize the ILD layer 242. The CMP process may partially or completely remove the hard mask layer 224.

After the formation of the ILD layer 242, an etch process is applied to remove the polysilicon or amorphous silicon of the gate stack 229 within the device region 214 and the overlay region 212. If the hard mask is present and is not removed at the CMP step, the etch process removes the hard mask layer 224 as well. In one embodiment, the etch process includes two steps where the first step is designed to remove the hard mask layer 224 and the second step is designed to remove the silicon in the gate stacks in the device region 214 and the overlay region 212. After the silicon in the gate stacks is removed, trenches result in the ILD layer 242 and are referred to as gate trenches.

In one embodiment, the first etch step to remove the hard mask layer 242 may include phosphoric acid ($H_3PO_4$) solution, hydrofluoric acid (HF), or buffered HF if the hard mask layer 224 include silicon nitride. In another embodiment, the etching process used to remove the polysilcion or amorphous silicon of the gate stacks may be dry etching, wet etching or combinations thereof. In one example, an etching solution including $HNO_3$, $H_2O$ and HF, or $NH_4OH$ solution, may be used to remove polysilicon (or amorphous silicon). In another example, chlorine (Cl)-based plasma may be used to selectively remove the polysilicon.

After the formation of the gate trenches, one or more metal gate material layers are formed in the gate trenches. In one embodiment, a metal layer 246 of a proper work function (referred to as a work function metal) and a conductive layer 248 are filled in the gate trenches. In one embodiment, the gate trenches in the device region 214 and overlay region 212 are deposited with a work function metal layer 246 and are then filled with the conductive material 248, forming a gate electrode for a nFET. The work function metal 246 for the nFET is referred to as a n-metal. The n-metal includes a metal-based conductive material having a work function compatible to the nFET. For one example, the n-metal has a work function of about or less than about 4.2 eV. In one embodiment, the n-metal includes tantalum (Ta). In another embodiment, the n-metal includes titanium aluminum nitride (TiAlN). In other embodiments, the n-metal includes Ta, TiAl, TiAlN, or combinations thereof. The n-metal may include various metal-based film as a stack for optimized device performance and processing compatibility. The n-metal layer can be formed by a suitable process, such as PVD. The conductive material layer 248 may include aluminum, tungsten or other suitable metal. Then, a CMP process may be applied to remove the excessive work function metal and the conductive material. In one embodiment, the device region 214 includes both nFETs and pFETs. In this embodiment, the metal gates are formed for the nFETs and pFETs, respectively by a proper procedure. For example, after the removal of the silicon from the silicon gate stacks, the metal gates for the nFETs and the overlay mark are formed by a deposition for the n-metal layer, a deposition for the conductive layer, and a CMP process to remove the excessive n-metal layer and the conductive layer while the pFETS are protected by a patterned photoresist layer. Then the metal gates for pFETs are formed by a deposition for the p-metal layer, a deposition for the conductive layer, and a CMP process to remove the excessive p-metal layer and the conductive layer. Alternatively, a p-metal layer is deposited for the pFETs while the nFETs are protected by a patterned photoresist layer. A n-metal layer is deposited for the nFETs and the overlay mark while the pFETs are protected by a patterned photoresist layer. Then, a conductive layer is deposited to fill gate trenches for nFETs, pFETs and the overlay mark. A CMP process is applied to the substrate to remove the excessive portion of the n-metal layer, p-metal layer, and conductive layer, forming the metal gates for nFETs, pFETs and overlay mark.

The p-metal includes a metal-based conductive material having a work function compatible to the pFET. For one example, the p-metal has a work function of about 5.2 eV or greater. In one embodiment, the p-metal includes titanium nitride (TiN) or tantalum nitride (TaN). In other embodiments, the p-metal include TiN, tungsten nitride (WN), tantalum nitride (TaN), or combinations thereof. The p-metal may include various metal-based film as a stack for optimized device performance and processing compatibility. The p-metal layer can be formed by a suitable process, such as physical vapor deposition (PVD), CVD, ALD, PECVD, PEALD or spin-on metal. The conductive material thereafter substantially fills in the gate trench. The conductive material includes aluminum or tungsten according to various embodiments. The method to form the conductive material may include PVD, CVD, ALD, PECVD, PEALD or spin-on metal. Then, a CMP process may be applied to remove the excessive work function metal and the conductive material, forming the metal gate. Although the semiconductor structure 200 only illustrates one field-effect transistor in the device region 214, a plurality of FETs and other devices can be formed in the device region. The present process to form the metal gates may have other alternative embodiment. For example, the metal gate for nFETs and pFETs may be formed by other sequence or other procedure.

In one embodiment, the metal gates may include a step to deposit a high-k dielectric material layer 244 the silicon oxide layer 220 in the gate trenches, and then a work function metal layer and a conductive layer are formed on the high-k dielectric material layer 244. This process is referred to as a high-k last process. Alternatively, in the high-k last process, the silicon oxide layer 220 is first removed before forming the work function metal layer and conductive material layer. In this case, a new interfacial layer, such as silicon oxide, is first formed on the semiconductor substrate 210, then the high-k dielectric material layer, work function metal layer and conductive material layer are formed in the corresponding gate trenches.

As described above, the overlay mark in the overlay region 212 including the gate stack 226 in the overlay region 212 is replaced by a metal gate. Particularly, the polysilicon in the gate stack 226 is replaced to form metal gates similar to the metal gate for the n-FETs in the device region 214 and formed in the same process to form the metal gates for the n-FETs. Therefore, the gate stacks in the overlay region 212 include the n-metal layer and the conductive material layer. In another example, the polysilicon gate stack 226 may be replaced to form metal gates similar to the metal gates for the p-FETs in the device region 214 and formed by the same process to form the metal gates for the p-FETs. In this case, the gate stacks in the overlay region 212 include the p-metal layer and the conductive material layer.

Figure 9:
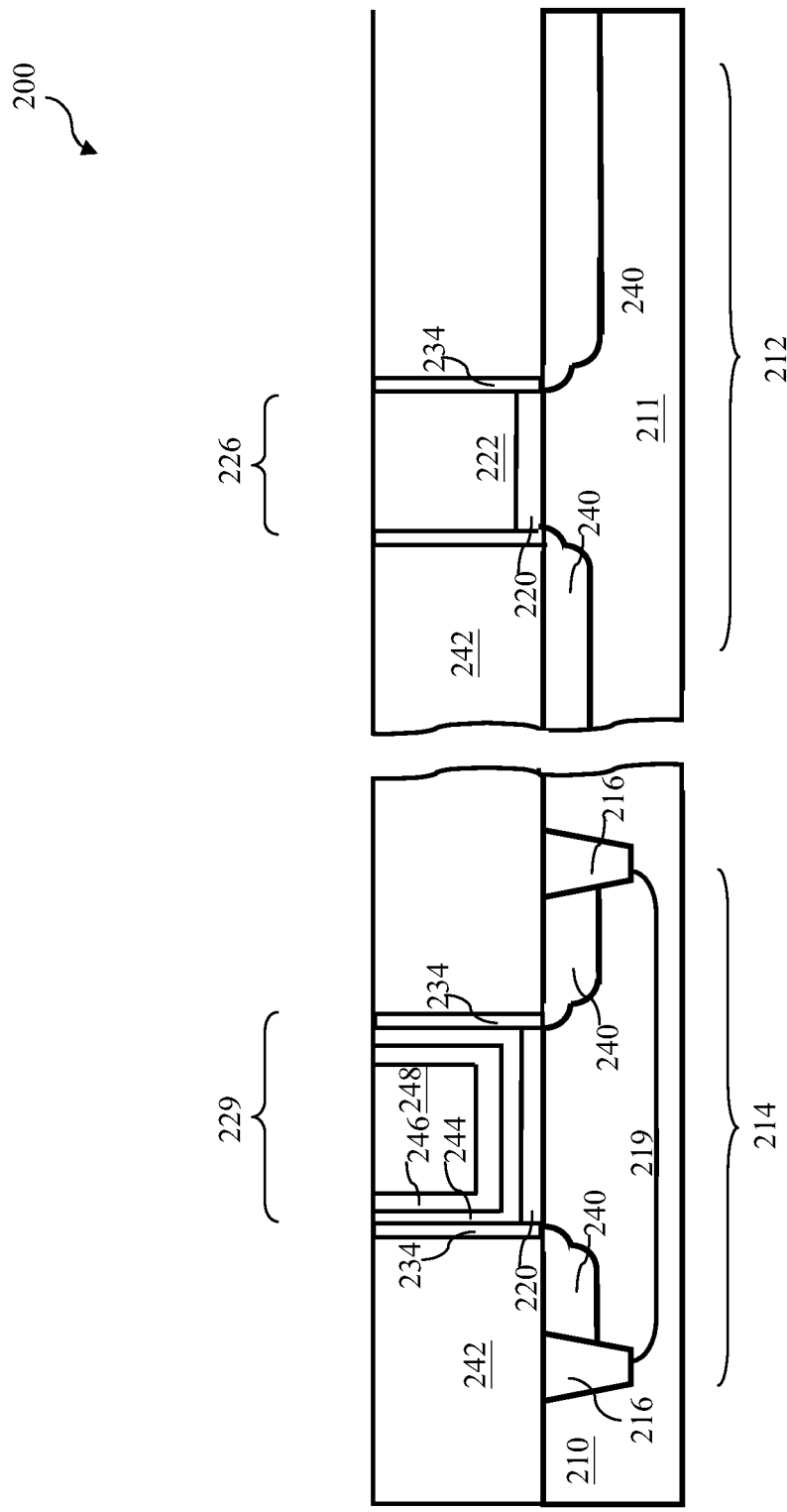

In another embodiment, the gate stacks for the overlay mark in the overlay region 212 remain as polysilicon gate stacks without replacement. In this case, the overlay region 212 is covered by a patterned mask layer such as a patterned photoresist layer or a patterned hard mask layer during the gate replacement to form metal gates for devices in the device region 214, as illustrated in FIG. 9.

Figure 10:
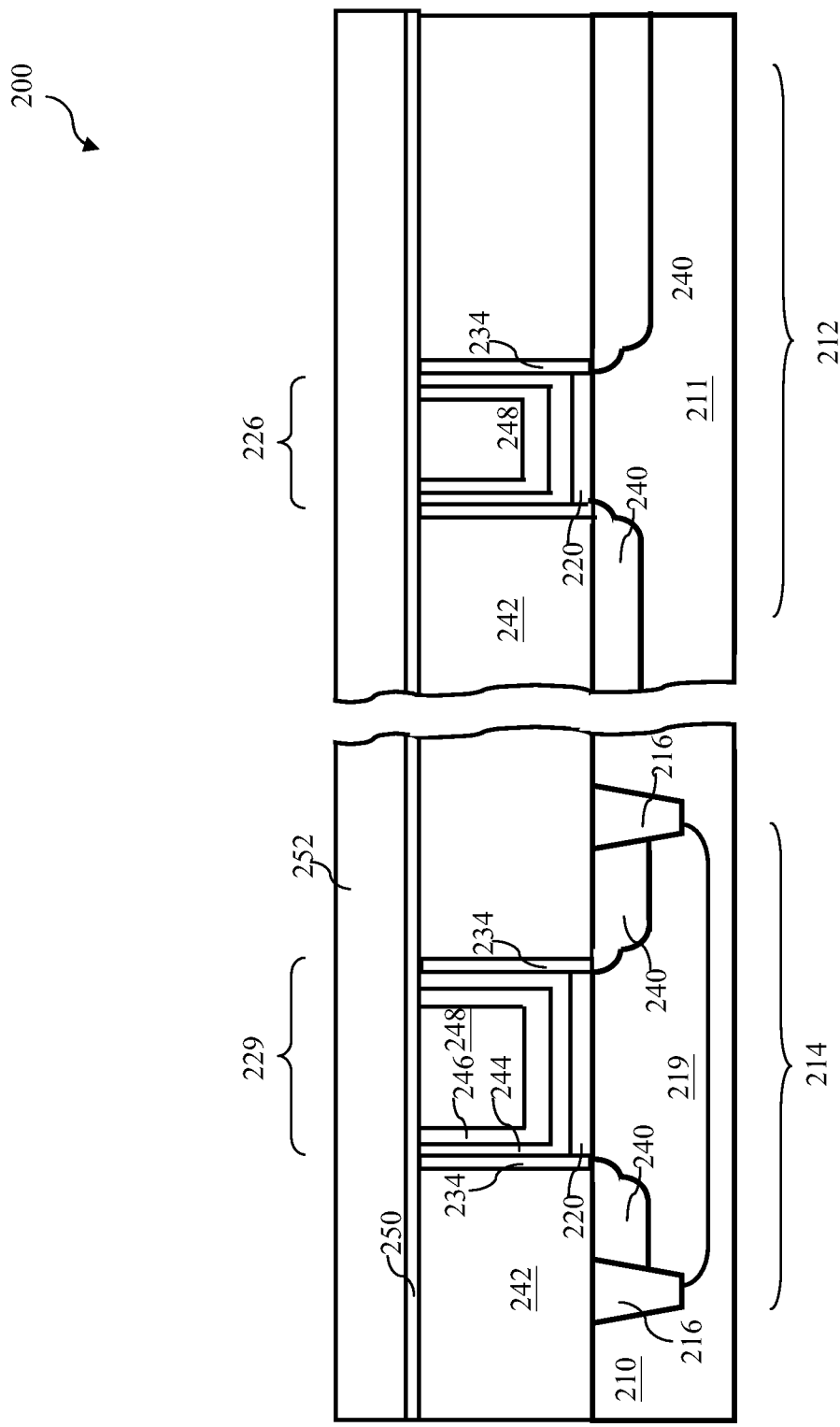

Referring to FIG. 10, the method 100 may proceed to step 114 by forming contact holes to electrical interconnection. In one embodiment, a contact etch stop layer (CESL) 250 is formed on the ILD layer 242 and another ILD layer 252 is formed on the CESL 250. Then a photoresist layer (not shown) is coated on the semiconductor structure 200 in a lithography process, and a soft baking may be applied to the coated photoresist layer. Then a photomask (or mask) having a contact pattern is placed on the lithography exposure apparatus and the semiconductor structure 200 is secured on a wafer stage of the lithography exposure apparatus. Then the photomask is aligned to the semiconductor structure 200 before exposing the coated photoresist layer. The overlay operation uses the overlay mark including the gate stack 226 in the overlay region 212. The overlay mark is further described with additional reference to FIG. 11A and 11B.

Figures 11A, 11B:
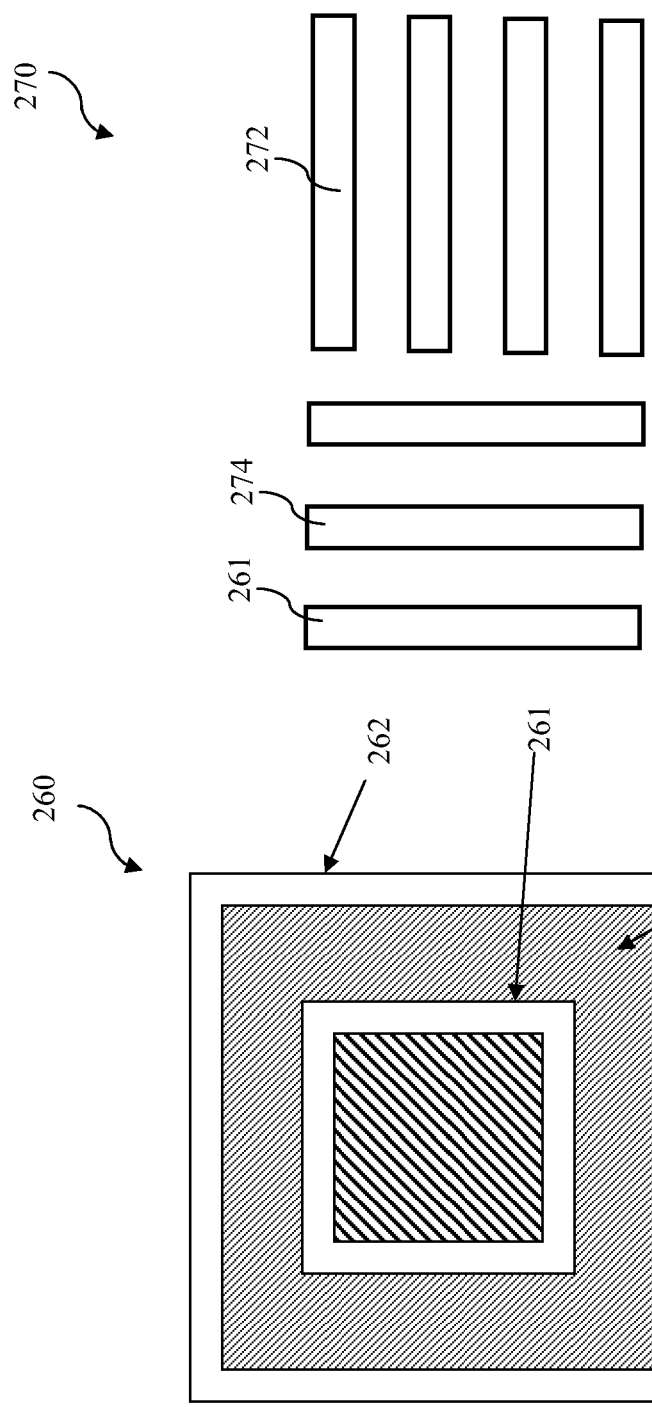
FIGS. 11A and 11B are top views of overlay marks of the semiconductor structure of FIG. 8 constructed according to various aspects of the present disclosure.

FIGS. 11A and 11B are top views of an overlay mark of the semiconductor structure of FIG. 8 constructed according to various aspects of the present disclosure. In FIG. 11A, an overlay mark is labeled with numeral 260. The overlay mark 260 is formed in the overlay region 212 of FIG. 8. The overlay mark 260 includes gate stack 226 and another layer 262. Layer 262 may be dummy oxides marking the OD layer or another overlay layer. In one example, the gate stacks have a width of about 1.6 micron and a spacing of about 1.6 micron.

In yet another embodiment as shown in FIG. 11B, the overlay mark 270 may include two sets of overlay layers configured to a grating structure with horizontal layer and vertical layers. One type of overlay layer may be horizontal, for example, multiple gate stacks 226. Another type of overlay layer may be vertical, for example, multiple layers of dummy oxide formed during the OD layer. In some embodiments, the grating structure in one orientation may include layers formed during different manufacturing steps, so that layers 226 and 274 may be different overlay layers. In another embodiment, a second set of grating marks may be oriented in the same direction but with a different grating pitch. The various embodiments in accordance with the present disclosure can also be used to improve the contrast between the grating marks and underlying substrate.

As the substrate 211 is doped by one or more doping processes, such as LDD doping, heavily doped S/D, and/or pocket implant, the refractive index of the substrate 211 is changed, and the WQ of the overlay signal is substantially increased.

Before exposing a photoresist in a lithography operation, the semiconductor wafer is positioned by the wafer stage to align between the photomask and the wafer by utilizing an alignment structure in an alignment operation. After the alignment, the coated photoresist layer is exposed field by field. In certain embodiments, the exposure parameters are adjusted field by field in a correction per exposure (CPE) technique based on prior acquired overlay error information. Other steps in the lithography process, such as post exposure baking (PEB), developing and hard baking, may follow to form the patterned photoresist layer with the pattern aligned with the other features (gate stacks, source and drain features) in the semiconductor structure. An etch process is applied to the ILD layers 242 and 252 and form contact holes in the ILD layers. Other processing steps may be subsequently implemented. In another embodiment, a conductive material, such as tungsten, is filled in the contact holes to form contacts. In one embodiment, a silicide is first formed on the semiconductor substrate 210 to reduce the contact resistance. The conductive material is thereafter filled in the contact holes to form contacts. A CMP process may subsequently remove the excess conductive material.

Although not shown, other alternative features and processing steps may be present. For example, the p-metal layer and n-metal layer or other layers may be formed in different orders or using a different process than that described above. Other processing steps may be implemented before, during and/or after the formation of the gate stacks and the overlay marks. For example, multilayer interconnections may be further formed after step 114. The multilayer interconnection includes vertical interconnects, such as conventional vias and horizontal interconnects, such as metal lines. The various interconnection features may use various conductive materials, such as including copper, tungsten and silicide.

The various embodiments in accordance with the present disclosure apply to a number of overlay mark combinations, not just the OD layer and the gate stack. As illustrated in FIG. 11A, a particularly important overlay mark 260 on a substrate includes the gate stack 262 and contact layers 261 with the ILD layer 263 in between. This overlay mark 260 is used to align subsequent layers during the interconnect formation where alignment for via landing is important. Inaccurate CPE caused by overlay error measurement error can cause device failure.

According to various embodiments, in order to achieve a refractive index of the semiconductor substrate in the overlay region to sufficiently improve WQ of the overlay signal a combined ion implantation boron dosage is greater than about $2 \times 10^{15}$ ions/cm$^2$ or greater than about $2.5 \times 10^{15}$ ions/cm$^2$. In some embodiments, a boron-containing compound such as boron fluoride ($BF_2$) may be used. A minimum combined ion implantation arsenic, phosphorus, or combined arsenic and phosphorus dosage is greater than about $3 \times 10^{15}$ ions/cm$^2$ or greater than about $3.2 \times 10^{15}$ ions/cm$^2$. The total ion implantation may also include one or more of the minimum dosage of indium at greater than about $1 \times 10^{14}$ ions/cm$^2$ or greater than about $1.1 \times 10^{14}$ ions/cm$^2$, nitrogen at greater than $1.2 \times 10^{15}$ ions/cm$^2$ or greater than $1.4 \times 10^{15}$ ions/cm$^2$, or carbon at greater than about $2.4 \times 10^{15}$ ions/cm$^2$ or greater than about $2.5 \times 10^{15}$ ions/cm$^2$.

The process in accordance with an embodiment of the present disclosure was implemented and compared. Two baseline wafers where the overlay mark region experienced the same process as the device region were subjected to CPE and residual overlay error measured. Two experimental wafers where the overlay mark region experienced the ion implant process as described herein were subjected to CPE and residual overlay error measured. The overlay errors after CPE for the baseline wafers were 16.3 nm and 16.6 nm. These error values would require rework during manufacturing. The overlay errors after CPE for the experimental wafers were 5.5 nm and 6.2 nm. These overlay error values for the experimental wafers show significant improvement in the overlay alignment using the processes in the present disclosure.

Using the same wafers, overlay errors were measured again using a different overlay mark and results compared after CPE. The baseline wafers had residual errors of 9.6 nm and 7.6 nm. The experimental wafers had residual errors of 3.3 nm and 3.2. Using a different overlay mark, the results again show significant improvement in the overlay alignment using the processes in the present disclosure.

The present disclosure is not limited to applications in which the semiconductor structure includes a FET (e.g. MOS transistor) or SRAM, and may be extended to other integrated circuit having a metal gate stack and the overlay mark. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The various patterning process may include forming a patterned photoresist layer by a photolithography process.

An exemplary photolithography process may include processing steps of photoresist spin-on coating, soft baking, mask aligning, exposing, post-exposure baking, developing photoresist and hard baking. The photolithography exposing process may also be implemented or replaced by other proper methods such as maskless photolithography, electron-beam writing, ion-beam writing, thermal lithography, and molecular imprint.

One aspect of this description relates to a partially fabricated semiconductor device. The partially fabricated semiconductor device includes a semiconductor overlay structure. The semiconductor overlay structure includes a first gate stack structure over the semiconductor substrate, the first gate stack structure being configured as an overlay mark in an overlay region of the semiconductor substrate. The semiconductor overlay structure further includes a doped region in the semiconductor substrate surrounding the first gate stack structure. The doped region has a first dopant concentration greater than or equal to a second dopant concentration next to a second gate stack structure in a device region of the semiconductor substrate.

Another aspect of this description relates to an overlay mark. The overlay mark includes a doped region in an overlay region of a semiconductor substrate, wherein the overlay region is free of active devices. The overlay mark further includes a plurality of gate stacks over the overlay region of the semiconductor substrate, wherein the plurality of gate stacks is arranged as a periodic grating structure. At least one gate stack of the plurality of gate stacks is a metal gate stack.

Still another aspect of this description relates to a semiconductor device. The semiconductor device includes a semiconductor substrate having a device region and an overlay region. The semiconductor device further includes a doped region in the overlay region. The semiconductor device further includes a first gate stack in the device region. The semiconductor device further includes a second gate stack in the overlay region. The semiconductor device further includes a first oxide layer over the semiconductor substrate surrounding the second gate stack. A total boron concentration in the doped region is greater than a boron concentration in the semiconductor substrate adjacent to the first gate stack. The second gate stack and the first oxide layer are measureable in an overlay error determination operation.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. A partially fabricated semiconductor device, comprising:
   a semiconductor overlay structure, the semiconductor overlay structure comprising:
      a first gate stack structure over the semiconductor substrate, the first gate stack structure being configured as an overlay mark in an overlay region of the semiconductor substrate;
      a doped region in the semiconductor substrate surrounding the first gate stack structure; and
      a contact layer over the semiconductor substrate in the vicinity of the first gate structure, wherein the doped region is between the first gate stack structure and the contact layer,
   wherein the doped region has a first dopant concentration greater than a second dopant concentration next to a second gate stack structure in a device region of the semiconductor substrate.

2. The partially fabricated semiconductor device of claim 1, wherein at least one of the first gate stack structure or the second gate stack structure comprises:
   a high-k dielectric material layer; and
   a metal layer over the high-k dielectric material layer.

3. The partially fabricated semiconductor device of claim 1, wherein at least one of the first gate stack structure or the second gate stack structure comprises:
   a silicon oxide layer; and
   a polysilicon layer over the silicon oxide layer.

4. The partially fabricated semiconductor device of claim 1, wherein the first gate stack structure is configured as a grating structure.

5. The partially fabricated semiconductor device of claim 1, wherein the first gate stack structure is configured as one box of a box-in-box structure.

6. The partially fabricated semiconductor device of claim 5, wherein the contact layer is configured as an inner box of the box-in-box structure.

7. The partially fabricated semiconductor device of claim 1, wherein the dopant comprises boron fluoride ($BF_2$) or arsenic.

8. The partially fabricated semiconductor device of claim 7, wherein the dopant further comprises indium, nitrogen, or carbon.

9. The partially fabricated semiconductor device of claim 1, wherein the semiconductor substrate in the overlay region includes silicon and has a refractive index of about 3 or less.

10. The partially fabricated semiconductor device of claim 1, further comprising a second gate structure in the overlay region, wherein the second gate structure comprises polysilicon, and the first gate structure comprises metal.

11. The partially fabricated semiconductor device of claim 1, further comprising an isolation feature between the first gate stack and the second gate stack.

12. An overlay mark, comprising:
   a doped region in an overlay region of a semiconductor substrate, wherein the overlay region is free of active devices, and the doped region is doped with one or more of boron fluoride ($BF_2$), arsenic, indium, nitrogen, or carbon; and
   a plurality of gate stacks over the overlay region of the semiconductor substrate, wherein the plurality of gate stacks is arranged as a periodic grating structure,
   wherein at least one gate stack of the plurality of gate stacks is a metal gate stack, and an entirety of a bottom surface of the at least one gate stack forms an interface with the semiconductor substrate.

13. The overlay mark of claim 12, wherein the at least one metal gate stack comprises a metal layer over a high-k dielectric material layer.

14. The overlay mark of claim 12, wherein at least one other gate stack of the plurality of gate stacks comprises:
   a silicon oxide layer; and
   a polysilicon layer over the silicon oxide layer.

15. The overlay mark of claim 12, further comprising:
   a contact layer over the semiconductor substrate in the vicinity of at least one gate structure of the plurality of gate structures, wherein, in a plan view, the doped region is between the at least one gate stack structure of the plurality of gate structures and the contact layer.

16. The overlay mark of claim 15, wherein the at least one gate stack of the plurality of gate stacks in the vicinity of the contact layer is configured as one box of a box-in-box structure.

17. The overlay mark of claim 16, wherein the contact layer is configured as an inner box of the box-in-box structure.

18. A semiconductor device, comprising:
a semiconductor substrate having a device region and an overlay region;
a doped region in the overlay region;
a first gate stack in the device region;
a second gate stack in the overlay region; and
a first oxide layer over the semiconductor substrate surrounding the second gate stack,
wherein
a total boron concentration in the doped region is greater than a boron concentration in the semiconductor substrate adjacent to the first gate stack, and
the second gate stack and the first oxide layer are measureable in an overlay error determination operation.

19. The semiconductor device of claim 18, wherein the second gate stack is configured as one box of a box-in-box structure.

20. The semiconductor device of claim 18, wherein the second gate stack is further surrounded by an interlayer dielectric layer and second oxide layer.

* * * * *